United States Patent
Yoon et al.

[19]

[11] Patent Number: 6,118,275
[45] Date of Patent: Sep. 12, 2000

[54] METHOD AND APPARATUS FOR MEASURING BATTERY CAPACITY USING VOLTAGE RESPONSE SIGNAL BASED ON PULSE CURRENT

[75] Inventors: Chul Oh Yoon; Yevgen Barsukov, both of Taejeon; Jong Hyun Kim, Seoul, all of Rep. of Korea

[73] Assignee: Korea Kumho Petrochemical Co., Ltd., Seoul, Rep. of Korea

[21] Appl. No.: 09/216,181

[22] Filed: Dec. 18, 1998

[30] Foreign Application Priority Data

Jun. 25, 1998 [KR] Rep. of Korea .................. 98-24134

[51] Int. Cl.[7] .................. G01N 27/416; H02J 7/00; H02J 7/04
[52] U.S. Cl. .................. 324/427; 324/430; 324/432; 320/129; 320/139
[58] Field of Search .................. 324/427, 430, 324/432, 433, 436; 320/129, 139

[56] References Cited

U.S. PATENT DOCUMENTS

| | | | |
|---|---|---|---|
| 3,808,487 | 4/1974 | Feuillade | 320/139 |
| 4,678,998 | 7/1987 | Muramatsu | 324/427 |
| 4,743,855 | 5/1988 | Randin et al. | 324/430 |
| 4,952,862 | 8/1990 | Biagetti | 320/132 |
| 5,241,275 | 8/1993 | Fang | 324/430 |
| 5,703,486 | 12/1997 | Arai et al. | 324/427 |
| 5,717,336 | 2/1998 | Basell et al. | 324/430 |

FOREIGN PATENT DOCUMENTS

0119547  9/1984  European Pat. Off. .

*Primary Examiner*—Safet Metjahic
*Assistant Examiner*—James C Kerveros
*Attorney, Agent, or Firm*—Perman & Green, LLP

[57] ABSTRACT

A method of measuring battery capacity using a voltage response signal based on a pulse current, where the method includes the steps of: measuring a voltage response signal based on a pulse current signal applied to a primary or secondary battery; performing an approximation of the measured voltage response signal to an equivalent circuit model composed of resistors, capacitors and transmission lines to determine the model parameters; and determining the unknown battery capacity from the voltage response characteristics based on a correlation between the measured capacity and the model parameters, which correlation is previously determined by a real-time discharge method, thereby takes a shorter time than a real-time discharge method and delivering efficiency and reliability in determining model parameters of an equivalent circuit which are in close correlation with the charge/discharge condition of the battery.

8 Claims, 7 Drawing Sheets

METHOD AND APPARATUS FOR MEASURING BATTERY CAPACITY USING VOLTAGE RESPONSE SIGNAL BASED ON PULSE CURRENT

BACKGROUND OF THE INVENTION

1. Field of the Invention

The present invention relates to a method of and apparatus for determining a unknown capacity of a primary or secondary battery by measuring and analyzing a voltage response signal based on a low-frequency pulse current of the battery. More particularly, it relates to a method of and apparatus for measuring battery capacity using a voltage response signal based on a pulse current, which provides a non-destructive measurement of battery capacity, for example, measuring a unknown remaining capacity of a standardized battery product, or in case of a manufacture, grading the rated capacity of the batteries.

2. Discussion of Related Art

A general method used for measuring battery capacity includes a real-time discharge method, which is to measure the usable time $t_d$ for a supply of electrical energy by the battery at a constant current $I_d$.

If the capacity is expressed in ampere-hour (Ah), the usable time td that a battery supplies electrical energy is given by Equation 1, which is used as the standard for evaluating battery capacity, for example, the Korean Industrial Standards.

$$t_d = Ah/I_d \quad \text{[Equation 1]}$$

A real-time discharge method is one for measuring battery capacity in a direct way and takes a long time throughout the discharge period in real time.

Also, a need of using a plurality of apparatuses arises to discharge multiple batteries independently if the user has to measure plural batteries in a simultaneous manner. This results in an inefficiency in the manufacture of batteries.

A more efficient method used for measuring battery capacity is one that enables a measurement of the battery characteristic for a short time relative to the discharge period of the battery in real-time, as a result of which accurate information can be obtained concerning charge/discharge condition or remaining capacity of the battery.

In regards to battery characteristics involved in the charge/discharge condition, there are used well-known methods for measuring open circuit voltage, voltage and its variations of battery in operation, output signal characteristic responsive to input voltage or current applied to battery, and thereby induced internal resistance or impedance function.

A use of these various methods provides a measurement of battery capacity for a short time relative to a real-time discharge method.

It is however necessary to provide a precise correlation between the measured value and the actual capacity in order to obtain battery capacity in the above-stated methods.

U.S. Pat. No. 3,808,487 discloses a method for sensing the charge condition of a storage battery with a response signal based on a pulse signal which has been periodically applied to the battery during the charge period.

According to the method, information concerning the charge condition and battery capacity is not extracted from the response signal but by a detection of changes in the measured signal, which is expected at the end point of charge.

In another method stated in U.S. Pat. No. 4,952,862, the remaining capacity can be calculated from the measured voltage and the discharge characteristic which is expressed in voltage-hour function including the Peukert parameter.

Especially, EP 119,547 discloses a method used for measuring discharge voltage as a function of time and determining the discharge condition from the averaged change rate of discharge voltage in a predetermined time interval.

When calculating the capacity from a measured voltage and its variants as described above, a precision of the correlation between the measured value and battery capacity is largely dependant upon the discharge characteristic.

For instance, a battery having a great uniformity of voltage provides extremely insignificant variations in the voltage against a change of discharge condition.

Therefore, the method is not considered to be a proper measurement for sensing the discharge condition of a battery.

In order to use a method disclosed in EP 119,547, the precision of a correlation between the measured value and battery capacity must be enhanced by increasing a period of time for measurement or discharge current, which arises an important problem of deterioration in the efficiency of measurement.

For a close correlation with battery capacity, it is very important to measure characteristics related to physical or chemical factors highly affected by the charge/discharge condition of battery, such as internal resistance or impedance.

U.S. Pat. No. 4,678,998 describes a method for examining the charge/discharge condition of battery using a correlation between the remaining capacity and the internal impedance at a specified frequency. This method has been proposed for the users to sense the charge/discharge condition of an automobile battery continuously.

In addition, there are various methods for determining battery capacity with two complex impedances each measured at a high or low frequency (see. U.S. Pat. No. 4,743,855), or with a linear impedance characteristic at a low frequency (see. U.S. Pat. Nos. 5,241,275 and 5,717,336).

An impedance having a close correlation with the charge/discharge condition of a battery is observed at a low frequency of several mHz.

Impedance characteristic in a low frequency band is expressed with a simple equivalent circuit composed of several resistances and condensers. Model parameters of the equivalent circuit are calculated from the measured complex impedance spectrum.

According to the present invention, a voltage signal responsive to pulse current is analyzed to obtain equivalent circuit model parameters of a low-frequency impedance.

A method using pulse signals provides the same model parameters as obtained in an impedance measuring method to determine equivalent circuit impedance model parameters at a low frequency.

The present invention uses a simple apparatus including a current generator for applying a pulse current, a voltmeter for measuring the output voltage, a control unit of the voltmeter, and an algorithm, as a result of which a similar time is taken in a measurement but more efficiency can be provided than the above-mentioned conventional methods.

Especially, the present invention presents a greatly efficient method and apparatus in a manufacture of battery products, since when measuring a plurality of batteries at the same time, a charging/discharging device used in measuring battery capacity in a real time can be reused or partly modified in use.

SUMMARY OF THE INVENTION

Accordingly, an object of the present invention is to provide a method of and apparatus for measuring a unknown battery capacity by measuring voltage response characteristics based on a pulse current and determining the battery capacity using the measured voltage response characteristics.

In accordance with an aspect of the present invention, a method of measuring battery capacity using a voltage response signal based on a pulse current includes the steps of: measuring a voltage response signal based on a pulse current signal applied to a primary or secondary battery; performing an approximation of the measured voltage response signal to an equivalent circuit model composed of resistors, capacitors and transmission lines to determine the model parameters; and determining the unknown battery capacity from the voltage response characteristics based on a correlation between the measured capacity and the model parameters, which correlation is preliminary examined by a real-time discharge method.

The present invention takes a shorter time than a real-time discharge method and delivers efficiency and reliability in determining model parameters of an equivalent circuit which are in close correlation with the charge/discharge condition of the battery It is to be understood that both the foregoing general description and the following detailed description are exemplary and explanatory and are intended to provide further explanation of the invention as claimed.

DETAILED DESCRIPTION OF PREFERRED EMBODIMENT

Hereinafter, a method of and apparatus for measuring battery capacity using a voltage response signal based on a pulse current according to the present invention will be described with reference to the accompanying drawings.

Characteristic impedance factors can be considered as follows, which have a correlation with capacity in the electrochemical reaction of an electrode active material related to the charge/discharge condition.

Figure 1A:
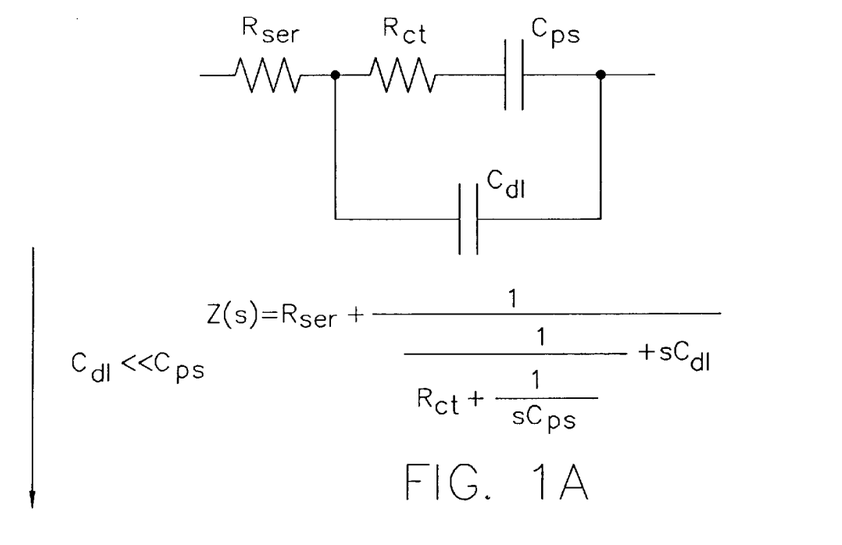
FIGS. 1a–1c are circuit diagrams of equivalent circuits having model parameters related to the electrochemical reaction of a battery.

As shown in FIG. 1a, the surface impedance $Z_i$ of substance A adsorbed to the surface of an electrode in an oxidation/reduction reaction $A-e^-=A^+$ can be expressed with a simple equivalent circuit model, which is composed of charge transfer resistance $R_{ct}$, pseudo capacitance $C_p$, double layer capacitance $C_{dl}$, and serial resistance $R_{ser}$ that is a coupling resistance of electrolyte and wires.

Pseudo capacitance $C_{ps}$ is given by equation 2:

$$C_{ps} = \frac{S \cdot F \cdot z}{dE/dc} \qquad \text{[Equation 2]}$$

where S is the surface area of the electrode, F is the Faraday constant, z is the number of migrating charges, and dE/dc is a potential-concentration coefficient.

Using the Nernst equation in Equation 2, we write Equation 3:

$$C_{ps} = \frac{F^2 c_0 z}{RT} \cdot \frac{\exp\left\{\frac{zF}{RT}(E-E_0)\right\}}{\exp\left\{\frac{zF}{RT}(E-E_0)\right\}+1} \qquad \text{[Equation 3]}$$

where $c_0$ and $E_0$ are concentration and electrochemical potential in the equilibrium state, respectively.

The pseudo capacitance $C_{ps}$ is a model parameter related to the amount of medium that participate in the reduction/oxidation reaction. The reaction structure may be more complex in an actual battery because the medium are not simply adsorbed to the electrode surface but distributed in the space of a porous electrode material. But, it can be approximated to an electrode adsorption model at a low frequency of several mHz, so that the pseudo capacitance can be extracted from a relationship with the imaginary number of the complex impedance at the low frequency. The relationship may be expressed by:

$$Z'' = -\frac{1}{\omega C_{ps}}$$

An application of such a model parameter related to the impedance spectrum has been described in detail by C. Ho, I. R. Raistrick, R. A. Huggins, J. Electrochem. Soc. 127, 343 (1980).

From the equivalent circuit, model parameters having a relation with battery capacity are primarily determined by the impedance characteristic at a low frequency.

Generally, response characteristic E(t) of a linear circuit as a function of an input signal I(t) in a given time interval is obtained from an inverse Laplace transform with respect to a product of a transfer function H(s) in the circuit system and the Laplace's transform I(s) of the input signal, as expressed by Equation 4:

$$E(t) = L^{-1}\{H(s)I(s)\} \qquad \text{[Equation 4]}$$

For a step-wise current input signal varying from 0 to $I_0$ in current intensity when t=0, the Laplace transform is given by, $$I(s) = \frac{I_0}{s},$$

and the transfer function H(s) is expressed by impedance function Z(s).

Figure 1B:
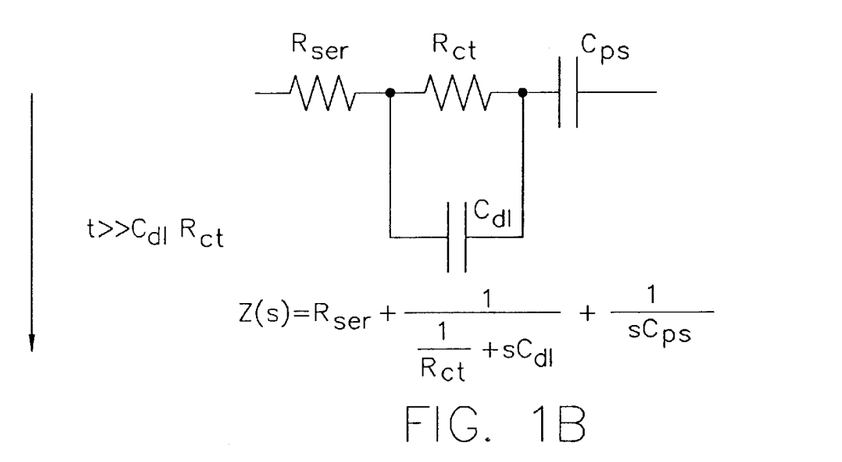

If $C_{dl} \ll C_{ps}$, the impedance function of an equivalent circuit shown in FIG. 1a can be approximated by Equation 5, which determines the impedance function given by the equivalent circuit of FIG. 1b.

$$Z(s) = R_{ser} + \frac{1}{sC_{ps}} + \frac{1}{1/R_{CT} + 1/sC_{dl}} \quad \text{[Equation 5]}$$

On the other hand, the inverse Laplace transform in Equation 4 is defined by the Bromwich integral equation expressed by:

$$f(t) = \frac{1}{2\pi i} \int_{\gamma=-i\infty}^{\gamma=+i\infty} F(s)e^{st} ds \quad \text{[Equation 6]}$$

The inverse Laplace transform of the integrated function in Equation 6 is realized simply with reference to the Laplace transform table of an analytical function, or through a numerical analysis (see. T. Hosono, 'Fast Inversion of Laplace Transform in BASIC', Kyoritsu Shupan, Tokyo (1984)).

In a case where $C_{dl} \ll C_{ps}$, the response characteristic of the equivalent circuit shown in FIG. 1a can be calculated by Equation 7 which is rewritten from Equations 5 and 6.

$$E(t) = I_0 R_{ser} + I_0 R_{ct} + \frac{I_0}{C_{ps}} t - I_0 R_{ct} \exp\left(-\frac{t}{C_{dl}R_{ct}}\right) \quad \text{[Equation 7]}$$

The response voltage characteristic based on a pulse current is expressed with a function having model parameters constituting an equivalent circuit according to Equation 7. Actually, the model parameters can be calculated by approximating the measured response characteristic to the function by way of a non-linear least squares method.

Figure 1C:
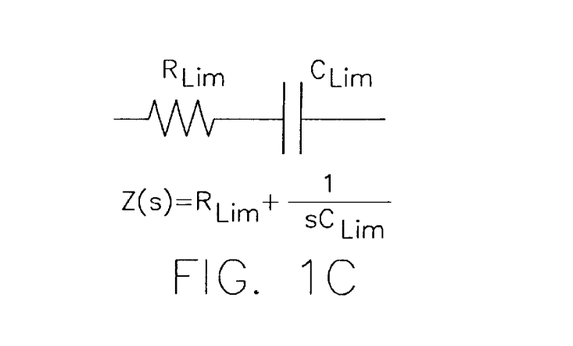
Figure 2:
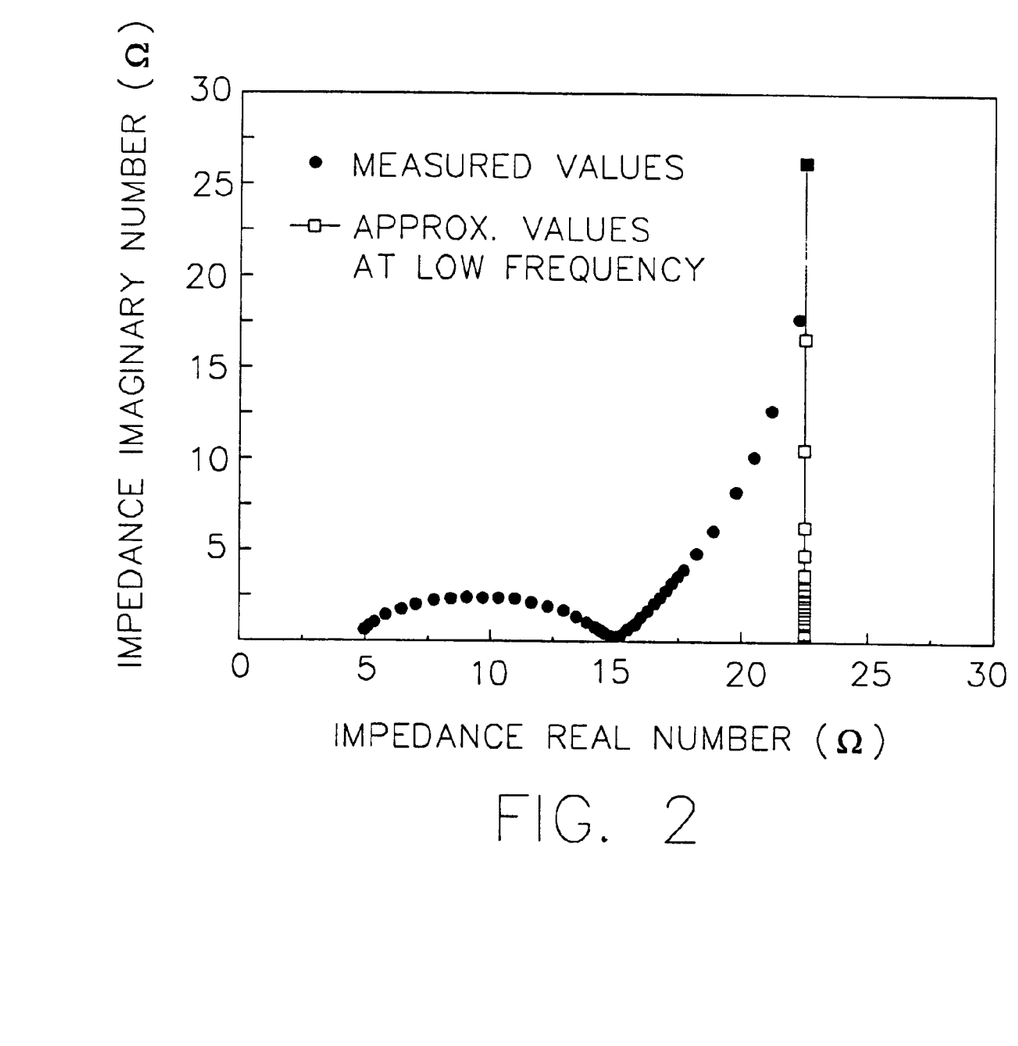
FIG. 2 is a graph showing measured impedances of a nickel metal hydride battery and approximated values according to the equivalent circuit at a low frequency.
Figure 3:
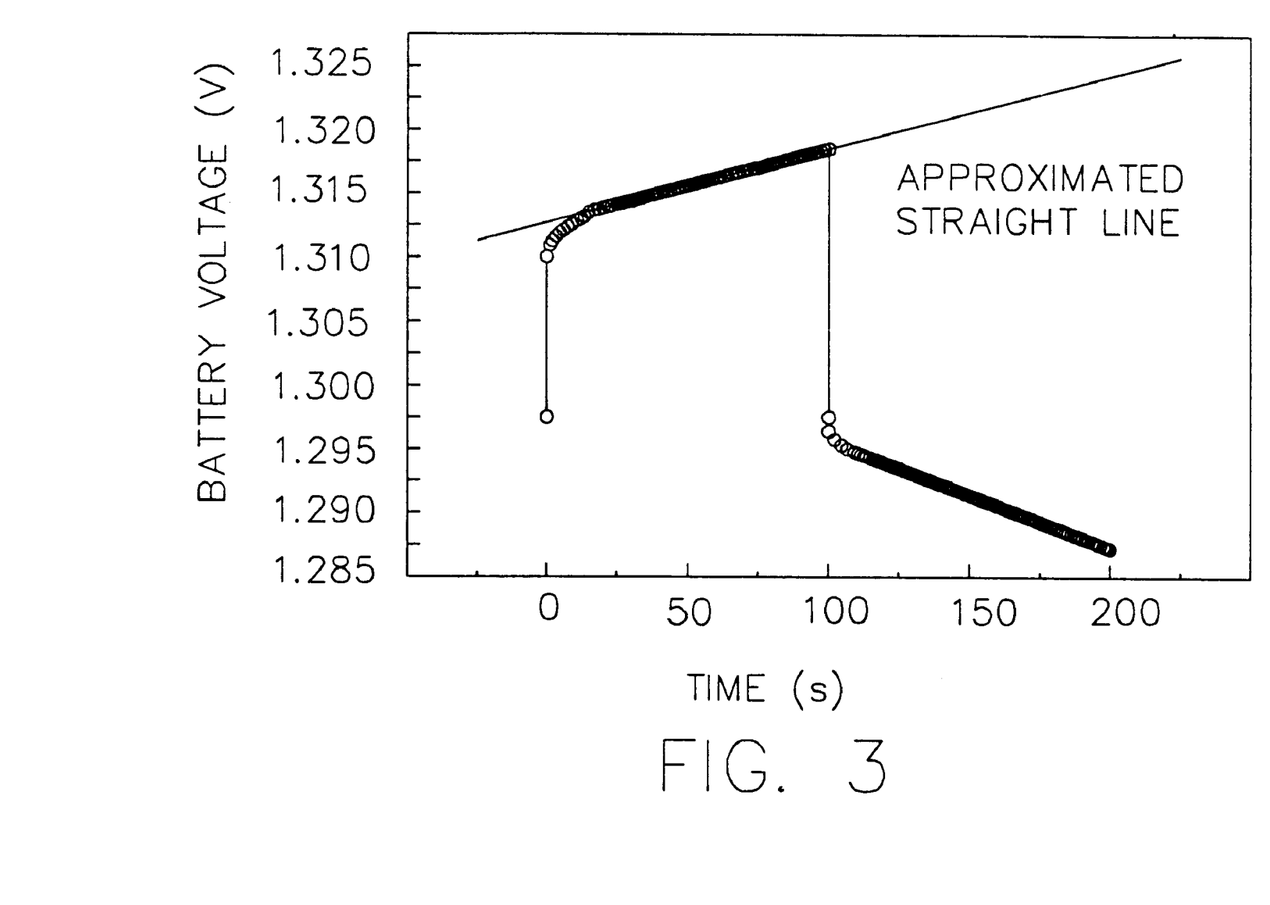
FIG. 3 is a graph plotting a voltage response curve against measured pulse currents of a nickel metal hydride battery and showing approximated values.

On the other hand, in a sufficient long time interval (where, time $t \gg C_{dl}R_{ct}$), the equivalent circuit expressed by Equation 5 can be approximated to the simpler form as shown in FIG. 1c.

This results in a linear response curve plotting the voltage against the current pulse.

Here, $R_{Lim} = R_{ser} + R_{ct}$ and $C_{Lim} \approx C_{ps}$

The current to be applied to the battery must be in a range of intensity such that the internal resistance causes a total voltage drop, not exceeding 40 mV.

The pulse has to be selected to have a length that the voltage signal can be approximated to have a linearity.

Figure 4:
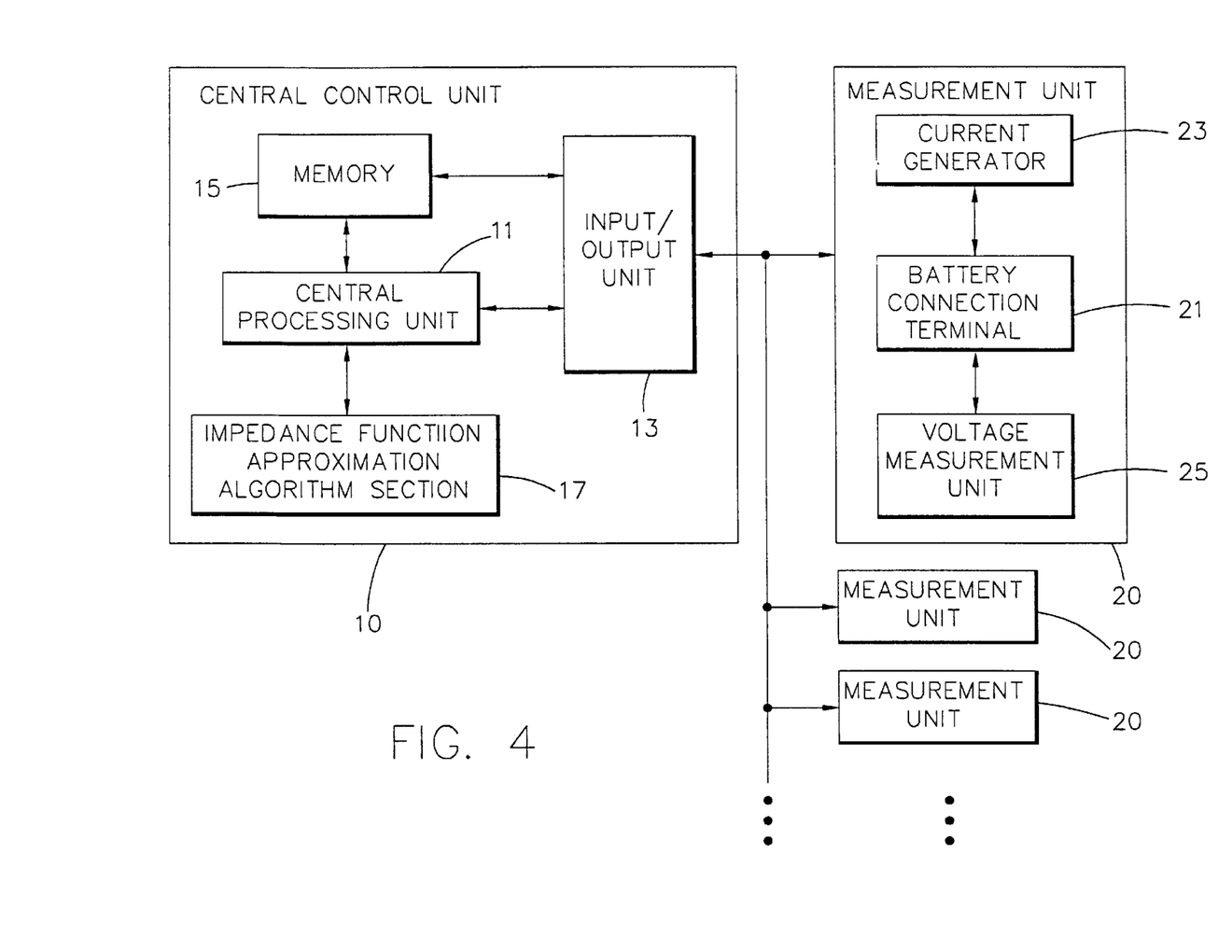
FIG. 4 is a circuit diagram of an apparatus for measuring battery capacity using a voltage response characteristic based on a pulse current in accordance with the present invention.

FIG. 4 is a circuit diagram of a device for measuring battery capacity using a voltage response characteristic based on a pulse current in accordance with the present invention.

As shown in FIG. 4, the present device has a single central control unit 10, and a plurality of measurement units 20 for detecting a response voltage based on the pulse current applied to the battery. The plural measurement units 20 are connected to the single central control unit 10 and perform a measurement independently of each other.

The central control unit 10 includes: a central processing unit 11 for controlling the measurement of the capacity of a test battery; an input/output unit 13 being in data communications with the measurement units 20; a memory 15 for storing voltage data detected by the measurement units 20 and transmitted via the input/output unit 13; and an impedance function approximation algorithm section 17 for approximating the voltage data stored in the memory 15 to a predetermined model parameter under the control of the central processing unit 11.

Each of the plural measurement units 20 includes: a battery connection terminal 21 connected to a test battery; a current generator 23 for applying a pulse current having predetermined intensity and width to the test battery which is connected to the battery connection terminal 21; and a voltmeter 25 for detecting the voltage data on both ends of the test battery connected to the battery connection terminal 21, digitizing the data and sending them to the central control unit 10.

To use the above-describe present apparatus for measuring battery capacity, the test battery must be connected to the battery connection terminal 21.

Here, a plurality of test batteries can be measured in regards to their capacity in a simultaneous manner by connecting the test batteries to the plural measurement units 20.

After this, connecting the test battery to the battery connection terminal 21, a pulse current having predetermined intensity and width is generated from the current generator 23 and applied to the test battery.

Subsequently, the voltages on both ends of the test battery have a voltage change in response to the applied pulse current.

Under such conditions, the voltmeter 25 of the measurement unit 20 detects the voltages of the test batteries, converts them to digital signals, which are transmitted to the central control unit 10 and sequentially stored in the memory 15 via the input/output unit 13.

After the completion of a measurement for the test battery, the central control unit 10 controls the impedance function approximation algorithm section 17 to perform an approximation of the measured results stored in the memory 15 to a predetermined model parameter.

Next, the central control unit 10 examines a correlation between the model parameter and the capacity measured by a real-time discharge method, determining a unknown capacity of the battery from a voltage response characteristic based on the pulse current according to the correlation.

Where a plurality of test batteries are measured for their capacity simultaneously in a multi-channel manner, the central control unit 10 carries out sequential operations of impedance function approximations. In this case, the required time is insignificant relative to the time required to measure the input and output signals.

Further, it is possible to realize a very effective apparatus for measuring and grading battery capacity by incorporating the standard battery products with a pulse current measurement unit and a general charge/discharge equipment for controlling the charge/discharge condition in real time.

Embodiment 1:

At a six-hour charge rate under constant current and room temperature condition, a nickel metal hydride battery (manufactured by Emmerich) having a nominal capacity of 600 mAh is fully charged and stabilized for about 10 minutes. During an application of +30 mA current (charging current) and −30 mA current (discharging current) each for 100 seconds to the nickel metal hydride battery, the voltage is measured as a function of time.

The intensity of the current pulse, 30 mA is determined in the range that maintains the linearity of a voltage response curve.

Low-frequency limit resistance $R_{Lim}$, and low-frequency limiting capacitance $C_{Lim}$ which are model parameters of the equivalent circuit of FIG. 1a are calculated from the slope and y-intercept of the linear line obtained through a linear approximation from the voltage response characteristic based on charge current.

In order to obtain the pulse current response characteristic in another discharge condition of the same battery, the nickel metal hydride battery is discharged each time by 30 mAh at a 60 mA constant current condition and repeatedly measured in regards to the pulse current in an analogous manner as described above. Subsequently, model parameters such as low-frequency limiting resistance $R_{Lim}$, and low-frequency limiting capacitance $C_{Lim}$ are calculated.

Figure 5A:
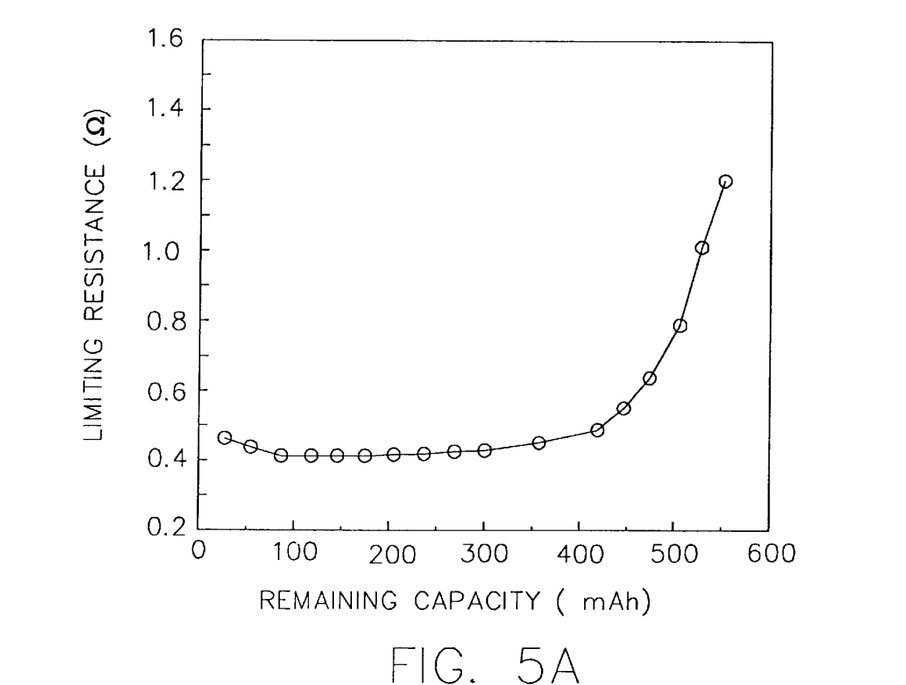
FIGS. 5a and 5b are graphs showing a correlation between model parameters and the remaining capacity of a nickel metal hydride battery in a discharge condition
Figure 5B:
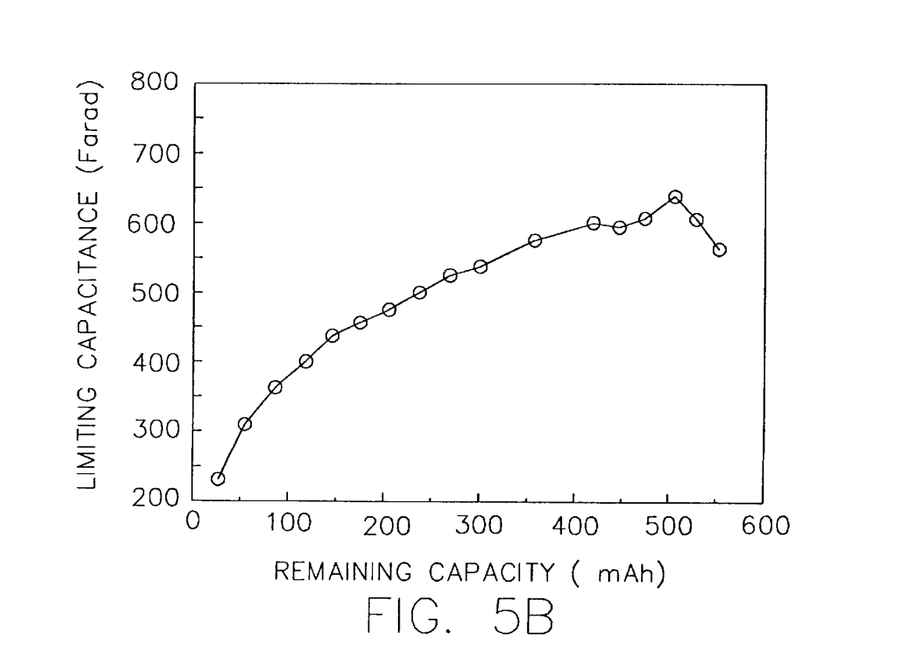

As apparent from table 1 and FIGS. 5a and 5b, a comparison of the remaining capacities of the battery which are measured in each discharge condition by a real-time discharge method at a 60 mA constant current condition reveals that there is a close correlation between the remaining capacity and the model parameters, i.e., low-frequency limiting capacitance and low-frequency limiting resistance.

TABLE 1

Results of an analysis for the response signals based on the pulse current of a 600 mAh nickel metal hydride battery.

| BATTERY CAPACITY (mAh) | $C_{Lim}$ (Farad) | $R_{Lim}$ (Ω) |
|---|---|---|
| 561 | 590.2 | 1.439 |
| 531 | 632.4 | 1.209 |
| 501 | 663.4 | 0.925 |
| 472 | 633.0 | 0.732 |
| 442 | 621.8 | 0.628 |
| 413 | 628.7 | 0.551 |
| 354 | 594.8 | 0.507 |
| 295 | 559.9 | 0.479 |
| 265 | 550.7 | 0.472 |
| 235 | 520.7 | 0.458 |
| 206 | 499.2 | 0.456 |
| 176 | 475.0 | 0.454 |
| 147 | 454.5 | 0.456 |
| 117 | 415.5 | 0.457 |
| 88 | 376.2 | 0.462 |
| 58 | 314.2 | 0.479 |
| 29 | 236.3 | 0.524 |

Embodiment 2:

A lithium ion battery (manufactured by Sony) having a regulated capacity of 1300 mAh is charged to 4.2 volts at the 1-hour rate in a constant current and room temperature condition, and stabilized for 2.5 hours under a 4.2 V constant voltage condition. After this, a voltage response curve of the battery is obtained after performing the same current pulse unit as described in Embodiment 1.

In order to obtain a response curve of the identical battery in another discharge state, the battery is discharged each time by 60 mAh in a 120 mA constant current condition and repeatedly measured in regards to the pulse current.

The used pulse current is +100 mA in intensity and has a time width of 400 seconds.

Figure 6A:
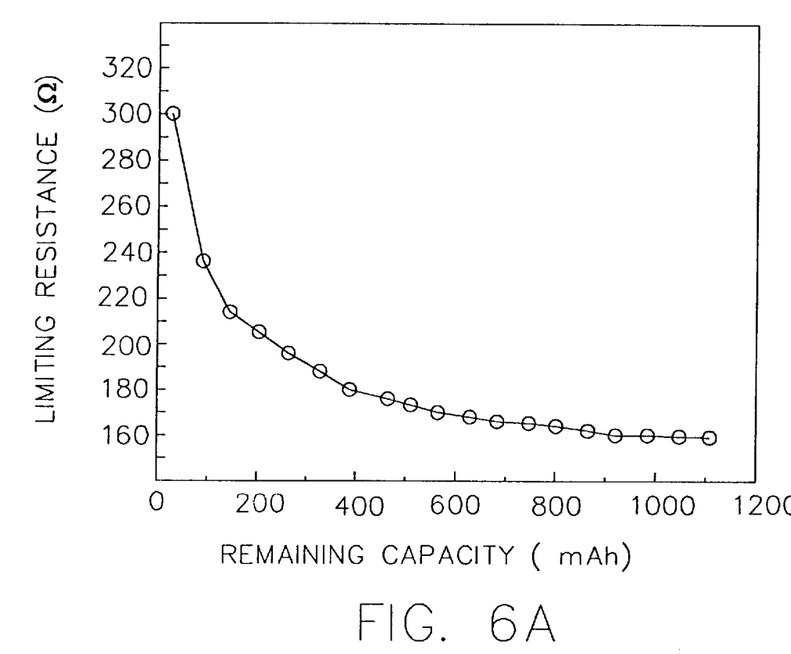
FIGS. 6a and 6b are graphs showing a correlation between model parameters and the remaining capacity of a lithium ion battery in a discharge condition.
Figure 6B:
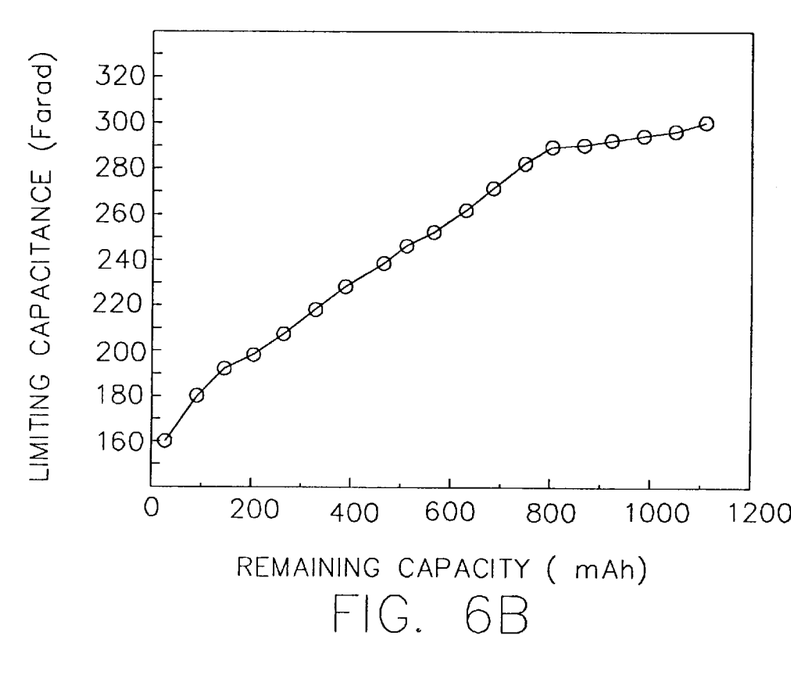

For each voltage response curve, model parameters such as low-frequency limiting resistance $R_{Lim}$, and low-frequency limiting capacitance $C_{Lim}$ are calculated through a linear least square fit of an impedance function corresponding to the equivalent circuit of FIG. 1c. As apparent from table 2 and FIGS. 6a and 6b, a comparison of the remaining capacities of the battery which are measured in each discharge condition by a real-time discharge method using a constant current of 120 mA reveals that there is a close correlation between the remaining capacity and the model parameters, i.e., low-frequency limiting capacitance and low-frequency limiting resistance.

The time required to measure the voltage response curve and obtain model parameters through an approximation in each discharge condition does not exceed 400 seconds.

TABLE 2

Results of an analysis for the response signals based on the pulse current of a 1300 mAh lithium ion battery.

| BATTERY CAPACITY (mAh) | $C_{Lim}$ (Farad) | $R_{Lim}$ (Ω) |
|---|---|---|
| 1110 | 1731.1 | 169.0 |
| 1050 | 1692.3 | 170.0 |
| 990 | 1677.7 | 170.6 |
| 930 | 1657.6 | 170.8 |
| 870 | 1651.3 | 171.8 |
| 810 | 1631.9 | 173.9 |
| 750 | 1574.2 | 175.1 |
| 690 | 1473.0 | 176.3 |
| 630 | 1384.5 | 178.4 |
| 570 | 1311.1 | 180.0 |
| 510 | 1248.6 | 182.8 |
| 450 | 1166.3 | 185.4 |
| 390 | 1099.4 | 191.3 |
| 330 | 994.4 | 198.3 |
| 270 | 905.4 | 207.4 |
| 210 | 823.0 | 215.3 |
| 150 | 761.2 | 225.6 |
| 90 | 649.5 | 246.0 |
| 30 | 484.9 | 309.5 |

Embodiment 3:

Six lithium ion batteries (manufactured by Sony) each of which has a nominal capacity of 1300 mAh and no record about its use history are charged, and a voltage response curve of each battery is obtained with the current pulse used in Embodiment 2.

Model parameters are calculated according to Equation 7.

Figure 7:
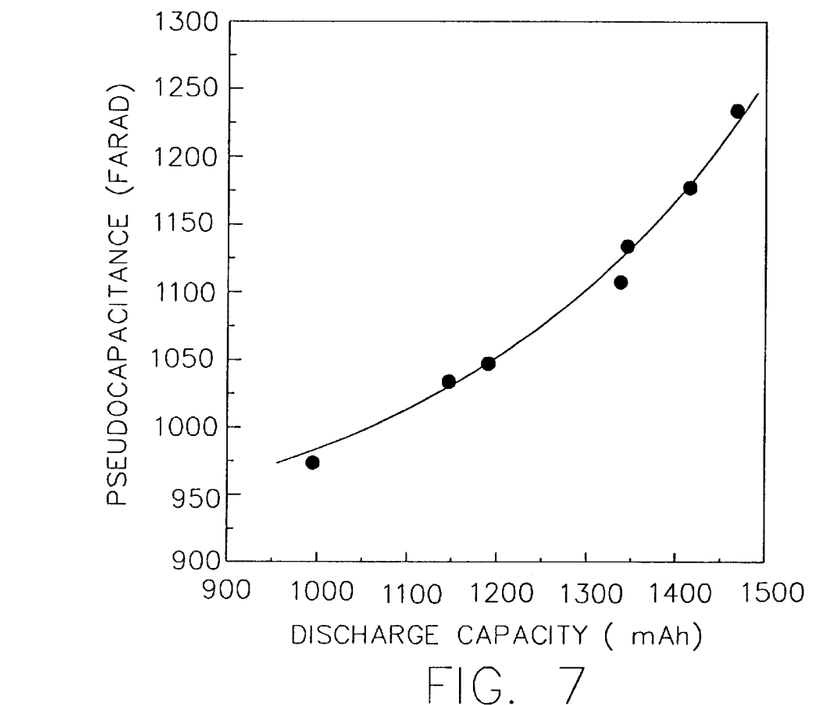
FIG. 7 is a graph showing a correlation between model parameters and the remaining capacity of a lithium ion battery in a full charge condition.

The batteries are discharged to a 2.7 volts at the 5-hour rate in a constant current and room temperature condition, and the discharge capacity of each battery for a measured discharge period is calculated. As apparent from table 3 and FIG. 7, there is a close correlation between the remaining capacity and the model parameters, i.e., double layer capacitance $C_{dl}$ and pseudo capacitance $C_{ps}$.

The time required to measure the voltage response curve and obtain model parameters through an approximation does not exceed 400 seconds.

TABLE 3

Results of an analysis for the electrical capacity and the response signals based on the pulse current of each lithium ion battery obtained through a real-time discharge method.

| CAPACITY (mAh) | $R_{ct}$ (Ω) | $C_{dl}$ (Farad) | $C_{ps}$ (Farad) |
|---|---|---|---|
| 1463 | 0.1939 | 14.67 | 1230.9 |
| 1409 | 0.1830 | 19.01 | 1174.9 |
| 1331 | 0.2352 | 25.89 | 1105.8 |
| 1189 | 0.2848 | 26.27 | 1045.8 |
| 1145 | 0.4595 | 28.52 | 1032.8 |
| 992 | 0.4619 | 28.60 | 973.1 |

Embodiment 4 (Comparative)

Figure 8:
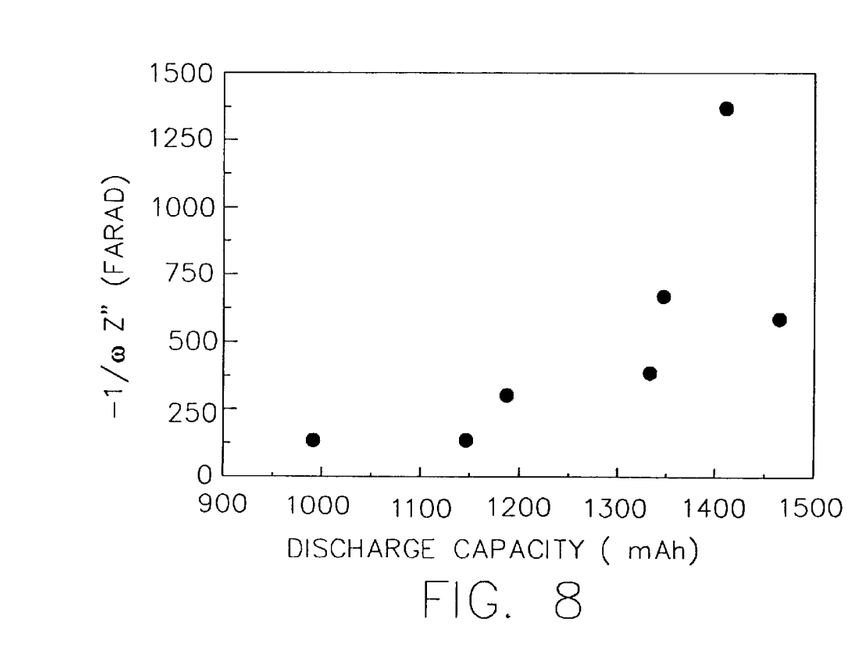
FIG. 8 is a graph showing a correlation between an electrical capacity calculated from an impedance imaginary number at a frequency of 5 mHz and the discharge capacity of a lithium ion battery in a full charge condition.

FIG. 8 shows a comparison of the remaining capacity and the pseudo electrical capacity of charged batteries used in Embodiment 3, where the model parameter, pseudo capacitance is not obtained by a pulse current method but calculated from an impedance value at a predetermined frequency.

The pseudo capacitance of the electrode adsorption model is given by an expression $-1/\omega Z''$, where $\omega$ is an angular velocity ($\omega = 2\pi \times$frequency) and $Z''$ is an impedance imaginary number. Compared to the results of Embodiment 3, there is less correlation between the remaining capacity and the pseudo capacitance calculated from an impedance at a frequency of 5 mHz, as illustrated in FIG. 8.

Embodiment 5 (Comparative)

Table 4 lists the required times in different measurements of the capacity of a charged battery used in Embodiment 1. In this embodiment, there are used a real-time discharge method; an impedance spectrum measurement method using a frequency scanning method which is performed by the number of selected frequencies at constant intervals in the range of 5 mHz to 20 kHz, e.g., (a), (b) and (c) being for 20, 40 and 60 frequencies, respectively; an impedance measurement method using a sine wave of 5 mHz frequency; and a pulse current method with a pulse wave.

As shown in Table 4, a use of the pulse current method in measurement of the remaining capacity of a battery provides a reduction in the required time.

TABLE 4

Comparison of required times in measurement of the battery capacity.

| A | B | C | D | Ref. |
|---|---|---|---|------|
| >1 hour | 363 sec | 200 sec | 100 sec | (a) |
|  | 620 sec |  |  | (b) |
|  | 880 sec |  |  | (c) |

Note.
A: real-time discharge method
B: frequency scanning method
C: impedance measurement method
D: pulse current method Such as in the present invention described above, there is provided with a measurement of a unknown capacity by measuring and analyzing the voltage response signal based on a pulse current applied to the primary or secondary battery, which method is excellent in efficiency and accuracy relative to the conventional capacity measurements. Accordingly, the present is applicable to a measurement of the remaining capacity used batteries or a standardization of batteries in electronic appliances, communication equipment and automobiles, or to a measurement and determination of the regulated capacity in a large-scaled manufacture of primary and secondary batteries.

What is claimed is:

1. A method of measuring battery capacity using a voltage response signal based on a pulse current, comprising the steps of:

measuring a voltage signal based on a pulse current signal applied to at least one end of a battery as a function of time;

analyzing the measured voltage signal to determine parameters, wherein the parameters are model parameters determined from an approximation of the measured voltage signal to an impedance function obtained from an equivalent circuit comprising resistances and model parameters of a condenser;

examining a correlation between the parameters and the capacity of the battery measured by a real-time discharge method; and based on the correlation, determining the unknown capacity of the battery from a voltage characteristic in response to the pulse current applied to the battery.

2. The method as defined in claim 1, wherein a required time in seconds to measure the voltage characteristic in response to the pulse current is below a discharge period in rated battery capacity.

3. The method as defined in claim 1, wherein the intensity of the pulse current in mA is below a pulse current intensity of a rated battery capacity when the battery is discharged.

4. The method as defined in claim 1, wherein analyzing the measured voltage signal is performed by fit of a function, obtained by an inverse Laplace transform of an impedance function obtained from the equivalent circuit in determining the parameters of the equivalent circuit.

5. An apparatus for measuring battery capacity using a voltage response signal based on an applied pulse current, the apparatus comprising:

a measurement unit for detecting voltages between both ends of a battery based on the pulse current applied to the battery; and a central control unit for performing an approximation of the voltages output from the measurement unit to predetermined model parameters, examining a correlation between the model parameters and the capacity of the battery measured by a real-time discharge method, and determining the unknown battery capacity from a voltage characteristic in response to the pulse current applied to the battery, based on the correlation.

6. The apparatus defined in claim 5, further comprising:

a plurality of the measurement units being connected to the central control unit via multiple channels and performing a measurement independently.

7. The apparatus defined in claim 5, wherein the central control unit comprises:

a central processing unit for controlling a measurement of the capacity of a test battery;

an input/output unit being in data communications with the measurement units;

a memory for storing voltage data at both ends of the battery measured by the measurement units and transmitted via the input/output unit; and an impedance function approximation algorithm section for approximating the voltage data stored in the memory to the predetermined model parameter under the control of the central processing unit.

8. The apparatus as defined in claim 5, the measurement units comprises:

a battery connection terminal connected to the test battery;

a current generator for applying a pulse current of predetermined intensity and width to the test battery connected to the battery connection terminal; and a voltameter for detecting the voltages at the both ends of the test battery connected to the battery connection terminal, converting the voltages to digital data, and transmitting the digital data to the central control unit.

* * * * *